United States Patent
Zhang et al.

(10) Patent No.: US 9,729,132 B1
(45) Date of Patent: Aug. 8, 2017

(54) PRECISE SIGNAL SWING SQUELCH DETECTOR

(71) Applicant: NXP B.V., Eindhoven (NL)

(72) Inventors: Xu Zhang, Chandler, AZ (US); Siamak Delshadpour, Chandler, AZ (US); Ahmad Yazdi, Chandler, AZ (US)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 15/222,561

(22) Filed: Jul. 28, 2016

(51) Int. Cl.
*G01R 19/00* (2006.01)
*H03K 5/24* (2006.01)

(52) U.S. Cl.
CPC .................. *H03K 5/2481* (2013.01)

(58) Field of Classification Search
CPC .................................................. H03K 5/2481
See application file for complete search history.

(56) References Cited

U.S. PATENT DOCUMENTS

| | | | | |
|---|---|---|---|---|
| 4,634,895 A | * | 1/1987 | Luong | G01R 19/04 327/62 |
| 4,998,289 A | * | 3/1991 | Rabe | H04B 1/1027 455/296 |
| 5,491,434 A | * | 2/1996 | Harnishfeger | H03D 1/02 327/50 |
| 7,880,508 B2 | * | 2/2011 | Presti | H03K 5/1532 327/58 |
| 8,538,362 B2 | | 9/2013 | Srivastava | |

OTHER PUBLICATIONS

Alegre, et al., "Design of a Novel Envelope Detector for Fast-Settling Circuits", IEEE Transactions on Instrumentation and Measurement, vol. 57, No. 1, Jan. 2008, 6 pages.
Zhak, "A Low-Power Wide Dynamic Range Envelope Detector", IEEE Journal of Solid-State Circuits, vol. 38, No. 10, Oct. 2003, pp. 1750-1753.

* cited by examiner

*Primary Examiner* — Kenneth B Wells

(57) ABSTRACT

A squelch detector, including: an input configured to receive an input signal; a peak detector connected to the input configured to detect a maximum value of the input signal wherein the peak detector includes a refresh input configured to receive a refresh signal to refresh the output of the peak detector, a valley detector connected to the input configured to detect a minimum value of the input signal wherein the valley detector includes a refresh input configured to receive the refresh signal to refresh the output of the valley detector, and a comparator including a first signal input connected to an output of the peak detector, a second input connected to an output of the valley detector, and a first reference input, wherein the comparator is configured to compare a difference between an output of the peak detector and an output of the valley detector and a reference value received at the first reference input and configured to produce an output based upon the comparison.

12 Claims, 2 Drawing Sheets

PRECISE SIGNAL SWING SQUELCH DETECTOR

TECHNICAL FIELD

Various exemplary embodiments disclosed herein relate generally to signal swing squelch detectors and methods.

BACKGROUND

Squelch is a circuit function that acts to suppress the output of a receiver in the absence of a sufficiently strong desired input signal. Squelch is applied in various communication systems.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to a squelch detector, including: an input configured to receive an input signal; a peak detector connected to the input configured to detect a maximum value of the input signal wherein the peak detector includes a refresh input configured to receive a refresh signal to refresh the output of the peak detector, a valley detector connected to the input configured to detect a minimum value of the input signal wherein the valley detector includes a refresh input configured to receive the refresh signal to refresh the output of the valley detector, and a comparator including a first signal input connected to an output of the peak detector, a second input connected to an output of the valley detector, and a first reference input, wherein the comparator is configured to compare a difference between an output of the peak detector and an output of the valley detector and a reference value received at the first reference input and configured to produce an output based upon the comparison.

Various embodiments further relate to method of producing a squelch indicator, including: receiving an input signal; detecting by a peak detector a maximum value of the input signal; detecting by a valley detector a minimum value of the input signal; comparing the difference between the detected maximum value and the detected minimum value and a reference value; determining a squelch indicator based upon the difference between the detected maximum value and the detected minimum value and a reference value.

Various embodiments further relate to squelch detector, including: an input configured to receive an input signal; a peak detector connected to the input configured to detect a maximum value of the input signal wherein the peak detector includes a refresh input configured to receive a refresh signal to refresh the output of the peak detector, wherein the peak detector includes a refresh switch and a peak sampling capacitor, and wherein the refresh switch is configured to discharge the peak sampling capacitor based upon the refresh signal; a valley detector connected to the input configured to detect a minimum value of the input signal wherein the valley detector includes a refresh input configured to receive the refresh signal to refresh the output of the valley detector, wherein the valley detector includes a refresh switch and a valley sampling capacitor, and wherein the refresh switch is configured to discharge the valley sampling capacitor based upon the refresh signal; a comparator including a first signal input connected to an output of the peak detector, a second input connected to an output of the valley detector, and a first reference input, wherein the comparator is configured to compare a difference between an output of the peak detector and an output of the valley detector and a reference value received at the first reference input and configured to produce an output based upon the comparison.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
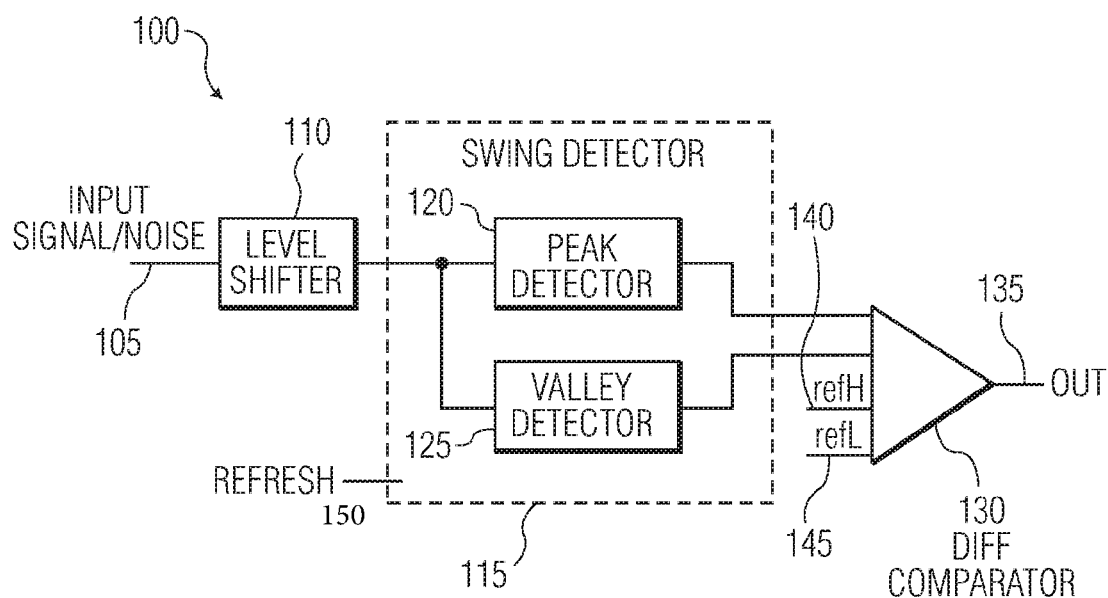
FIG. 1 illustrates an embodiment of a squelch detector.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Communication standards, e.g., universal serial bus (USB) power delivery (PD), require a transceiver to be capable of identifying signal from noise. Traditionally, such task is performed by a squelch detector that includes a peak detector and a comparator. This traditional squelch detector monitors the amplitude of an AC coupled input. However, duty cycle distortion, voltage asymmetry of the signal, and a leaky discharge path significantly degrade the accuracy of the detection. For example, existing squelch detectors for high frequency sinusoidal signals are not effective for arbitrary signals, which have duty cycle distortion, varying frequency, varying common mode, etc. Further, squelch detection methods for differential signals are only suitable for differential input signals with a high accuracy. For such squelch detection methods to work with single ended signal, a differential-to-single-ended conversion is needed, which will degrade the accuracy significantly. In addition, the differential-to-single-ended conversion will be flawed when the common mode varies.

Embodiments of a squelch detector will be described that detect the swing of an input signal. This squelch detector may include a peak detector, a valley detector, and a differential comparator. The input of the squelch detector may be input to the peak and valley detectors with or without a level shifter. The outputs of the peak and valley detectors are then applied to the differential comparator, where the voltage difference of the peak and valley detectors are compared to a reference voltage difference. In order to achieve accurate detection, there is no constant discharge path in either the peak or valley detector. The signal swing is updated using a refresh mechanism, which discharges the sampling capacitors of the peak and valley detectors periodically.

One example of where the embodiments described herein may be applied is to USB PD communication using a biphase mark code (BMC) on the configuration channel (CC) lines. These embodiments further may be applied to any other data communication requiring a squelch detector that monitors the AC swing of its input.

Using both a peak detector and a valley detector to sample the input signal results in a measurement of the swing that is not sensitive to the duty cycle distortion and asymmetry of the signal. Further, the input may be DC coupled to the squelch detector instead of AC coupled. In addition, the proposed refresh mechanism eliminates a trade-off between accuracy and working frequency. Also, the input swing is sampled and refreshed periodically to avoid the inaccuracy due to a constant discharge path connected to the sampling capacitor.

FIG. 1 illustrates an embodiment of a squelch detector. The squelch detector 100 may include a level shifter 110, a swing detector 115, and a differential comparator 130. The swing detector 115 may include a peak detector 120, a valley detector 125, and a refresh input 150.

The squelch detector 100 receives an input signal 105 at the level shifter 110. The level shifter may shift the level of the input signal 105. As will be further described below the level shifter 100 is optional. The input signal 105 (whether level shifted or not) is input to the swing detector 115. The swing detector 115 inputs the input signal 105 to both the peak detector 120 and the valley detector 125. The peak detector 120 outputs the maximum value of the input signal. The valley detector 125 outputs the minimum value of the input signal. In order to keep the maximum and minimum input values current, a refresh signal may be received at the refresh input 150 to reset the maximum and minimum values of the input signal.

The swing detector 115 outputs the maximum input value from the peak detector 120 and the minimum input value from the valley detector to a differential comparator 130. The differential comparator 130 may also receive reference values refH and refL at a reference high input 140 and a reference low input 145 respectively. The differential comparator 130 may then compare the difference between the outputs from the peak detector 120 and the valley detector 125 to the difference between the refH and refL values, and the differential comparator 130 produces an output or indicator that indicates whether the difference between the outputs from the peak detector 120 and the valley detector 125, i.e., the swing, is greater than or less than the difference between the refH and refL values. When the swing is less than the difference between the refH and refL values, then squelch may be applied.

It is noted that the differential comparator may alternatively include only a single reference input that receives a reference value that is compared to the swing.

As described above, use of a level shifter 110 is optional. The level shifter may be used if: 1) the inaccuracy resulting from the circuit non-idealities, e.g., negative-bias temperature instability (NBTI) effects of the p-channel metal-oxide-semiconductor field-effect transistor (PMOS) differential pairs in the detectors and the comparator is greater than inaccuracy due to the level shifter, because the peak detector 120, valley detector 125, and differential comparator 130 may adopt n-channel metal-oxide-semiconductor field-effect transistor (NMOS) differential pairs rather than the PMOS pairs; or 2) the input pin has a stringent leakage requirement, as in USB Type-C and PD specifications.

Figure 2:
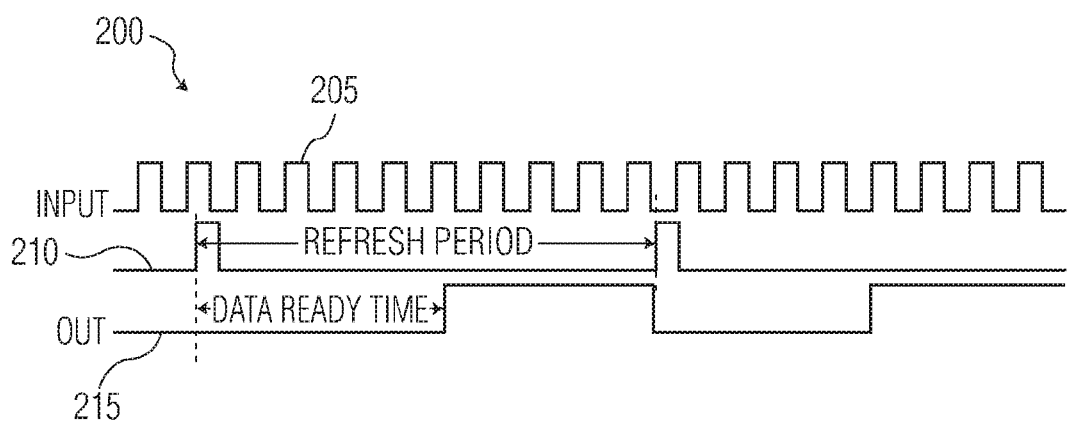
FIG. 2 illustrates an input signal, a refresh signal, and the timing of the output signal.

FIG. 2 illustrates an input signal, a refresh signal, and the timing of the output signal. The input signal 205 is shown as a pulsed signal, but could be any type of input signal. The refresh signal 210 has a refresh period. When a refresh signal 210 is received the peak detector 120 and valley detector 125 are refreshed by resetting the minimum and maximum measured values of the input signal 205. The output signal may have a data ready time (as indicated by the plot 215) during which the output signal does not have a valid value as the outputs of the swing detector 115 have to settle after the refresh occurs. The refresh period has a minimum value based upon the data ready time. The maximum refresh period would be driven by the specific input communication signal 205 received by the squelch detector 100. Further, the output of the squelch detector 100 may maintain its output value at a refresh and during the data ready time until the output value of the swing detector 115 has settled.

Figure 3:
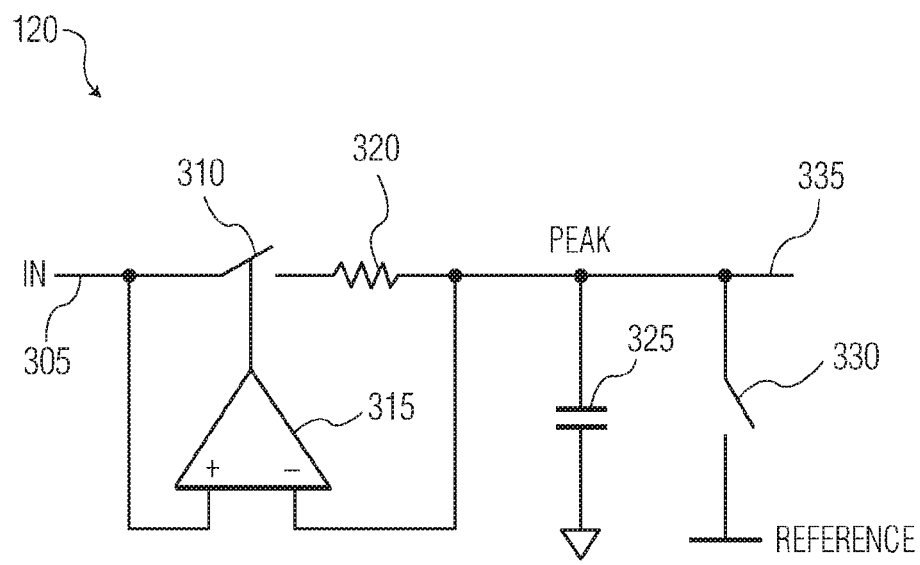
FIG. 3 illustrates an embodiment of a peak detector.

FIG. 3 illustrates an embodiment of a peak detector. The peak detector 120 may include an input 305, a peak switch 310, a peak comparator 315, a resistor 320, a peak sampling capacitor 325, a discharge switch 330, and a peak output 335. The peak detector 120 receives the input signal at its input 305 which is then fed to the positive input of the peak comparator 315 and the peak switch 310. The peak switch 310 connects the input 305 to the resistor 320 and is controlled by the output signal of the peak comparator 315. The resistor 320 further connects to the peak sampling capacitor 325. As shown, the resistor 320 and the peak sampling capacitor 325 are also connected to the negative input of the peak comparator 315. The discharge switch 330 is connected to the peak sampling capacitor 325.

The peak detector 120 operates as follows. The input signal is applied to the peak comparator 315. The peak comparator 315 compares the input voltage to a voltage on the peak sampling capacitor 325. When the input voltage is greater than the voltage on the peak sampling capacitor 325, the peak comparator 315 outputs a signal to the peak switch 310 that causes the peak switch 310 to close. When the peak switch 310 closes the input voltage is then charged onto the peak sampling capacitor 325. Once the input signal voltage becomes less than the voltage on the peak sampling capacitor 325, the peak comparator 315 outputs a signal that opens the peak switch 310. As a result, the voltage on the peak sampling capacitor 325 indicates the maximum voltage from the input signal. As the peak detector 120 operates, when a new peak input voltage is received, it will be larger than the voltage on the peak sampling capacitor 325 so that the peak comparator 315 closes the peak switch 310 so that the input voltage can be applied to the peak sampling capacitor 325. As a result the peak sampling capacitor 325 now indicates the new maximum value of the input voltage. When a refresh signal is received, the refresh switch 330 closes to discharge the peak sampling capacitor 325 to a reference level which may also be the ground level or the DC level of the input signal. Accordingly, the discharge path of the peak sampling capacitor 325 is controlled by the refresh signal.

Figure 4:
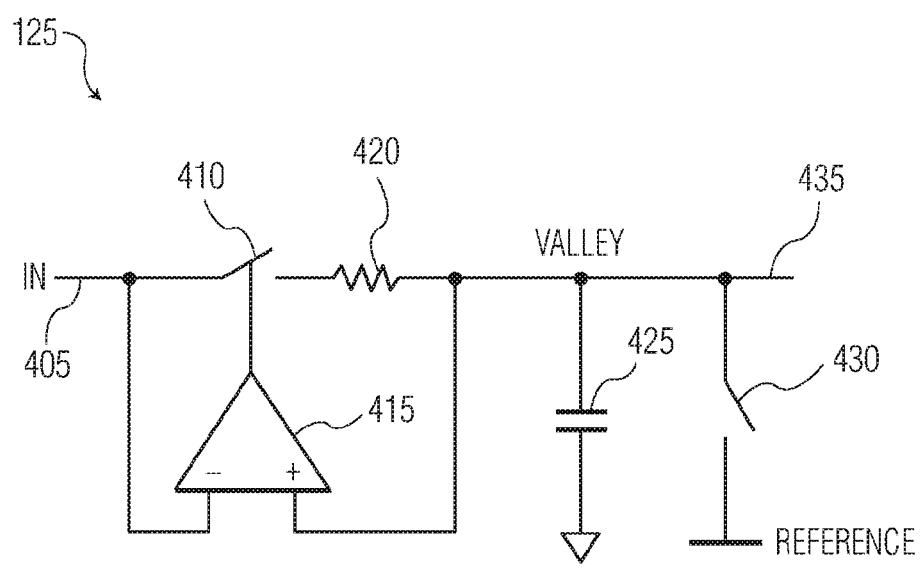
FIG. 4 illustrates an embodiment of a valley detector.

FIG. 4 illustrates an embodiment of a valley detector. The valley detector 125 may include an input 405, a valley switch 410, a valley comparator 415, a resistor 420, a valley sampling capacitor 425, a discharge switch 430, and a valley output 435. The valley detector 125 receives the input signal at its input 405 which is then fed to the negative input of the valley comparator 415 and the valley switch 410. The valley switch 410 connects the input 405 to the resistor 420 and is controlled by the output signal of the valley comparator 415. The resistor 420 further connects to the valley sampling capacitor 425. As shown, the resistor 420 and the valley sampling capacitor 425 are also connected to the positive input of the valley comparator 415. The discharge switch 430 is connected to the valley sampling capacitor 425.

The valley detector 125 operates as follows. The input signal is applied to the valley comparator 415. The valley comparator 415 compares the input voltage to a voltage on the valley sampling capacitor 425. When the input voltage is less than the voltage on the valley sampling capacitor 435, the valley comparator 415 outputs a signal to the valley switch 410 that causes the valley switch 410 to close. When the valley switch 410 closes the input voltage is then charged onto the valley sampling capacitor 425. Once the input signal voltage becomes greater than the voltage on the valley sampling capacitor 425, the valley comparator 415 outputs a signal that opens the valley switch 410. As a result, the voltage on the valley sampling capacitor 425 indicates the minimum voltage from the input signal. As the valley detector 125 operates, when a new minimum input voltage is received, it will be smaller than the voltage on the valley sampling capacitor 425 so that the valley comparator 415 closes the valley switch 410 so that the input voltage can be applied to the valley sampling capacitor 425. As a result the valley sampling capacitor 425 now indicates the new minimum value of the input voltage. When a refresh signal is received, the refresh switch 430 closes to discharge the valley sampling capacitor 425 to a reference level which may also be the ground level or the DC level or the input signal. Accordingly, the discharge path of the valley sampling capacitor 425 is controlled by the refresh signal.

Other peak and valley detectors that may be refreshed may be used in the swing detector 115 as well.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A squelch detector, comprising:
   an input configured to receive an input signal;
   a peak detector connected to the input configured to detect a maximum value of the input signal wherein the peak detector includes a refresh input configured to receive a refresh signal to refresh an output of the peak detector;
   a valley detector connected to the input configured to detect a minimum value of the input signal wherein the valley detector includes a refresh input configured to receive the refresh signal to refresh an output of the valley detector;
   a comparator including a first input connected to the output of the peak detector, a second input connected to the output of the valley detector, and a first reference input,
   wherein the comparator is configured to compare a difference between the output of the peak detector and the output of the valley detector and a reference value received at the first reference input and configured to produce an output based upon the comparison;
   wherein the comparator further comprises a second reference input; and
   wherein the comparator is configured to compare the difference between the output of the peak detector and the output of the valley detector and a difference between the reference value received at the first reference input and a reference value received at the second input.

2. The squelch detector of claim 1, further comprising a level shifter connected to the input configured to shift the level the input signal.

3. The squelch detector of claim 1, wherein the peak detector includes
   a refresh switch and
   a peak sampling capacitor,
   wherein the refresh switch is configured to discharge the peak sampling capacitor based upon the refresh signal.

4. The squelch detector of claim 1, wherein the valley detector includes
   a refresh switch and
   a valley sampling capacitor,
   wherein the refresh switch is configured to discharge the valley sampling capacitor based upon the refresh signal.

5. The squelch detector of claim 1,
   wherein when the difference between the output of the peak detector and the output of the valley detector is less than the reference value received at the first reference input, the output of the comparator indicates that squelch is to be applied.

6. A method of producing a squelch indicator, comprising:
   receiving an input signal;
   detecting by a peak detector a maximum value of the input signal;
   detecting by a valley detector a minimum value of the input signal;
   comparing a difference between the detected maximum value and the detected minimum value and a reference value;
   determining a squelch indicator based upon the difference between the detected maximum value and the detected minimum value and the reference value;
   wherein the reference value is the difference between a high reference value and a low reference value.

7. The method of claim 6, further comprising refreshing the maximum value of the input signal and the maximum value of the input signal based upon a refresh signal.

8. The method of claim 6, further comprising level shifting the input signal.

9. The method of claim 6,
   wherein the squelch indicator indicates the application of squelch when the difference between the detected maximum value and the detected minimum value is less than the reference value.

10. A squelch detector, comprising:
    an input configured to receive an input signal;

a peak detector connected to the input configured to detect a maximum value of the input signal
  wherein the peak detector includes a refresh input configured to receive a refresh signal to refresh an output of the peak detector,
  wherein the peak detector includes a refresh switch and a peak sampling capacitor, and
  wherein the refresh switch is configured to discharge the peak sampling capacitor based upon the refresh signal;
a valley detector connected to the input configured to detect a minimum value of the input signal
  wherein the valley detector includes a refresh input configured to receive the refresh signal to refresh an output of the valley detector,
  wherein the valley detector includes a refresh switch and a valley sampling capacitor, and
  wherein the refresh switch is configured to discharge the valley sampling capacitor based upon the refresh signal;
a comparator including
  a first input connected to the output of the peak detector,
  a second input connected to the output of the valley detector, and
  a first reference input,
  wherein the comparator is configured to compare a difference between the output of the peak detector and the output of the valley detector and a reference value received at the first reference input and configured to produce an output based upon the comparison,
  wherein the comparator further comprises a second reference input; and
  wherein the comparator is configured to compare the difference between the output of the peak detector and the output of the valley detector and a difference between the reference value received at the first reference input and a reference value received at the second input.

11. The squelch detector of claim 10, further comprising of
a level shifter connected to the input configured to shift the level of the input signal.

12. The squelch detector of claim 10,
wherein when the difference between the output of the peak detector and the output of the valley detector is less than the reference value received at the first reference input, the output of the comparator indicates that squelch is to be applied.

* * * * *